(12) United States Patent
Bold et al.

(10) Patent No.: US 7,585,775 B1
(45) Date of Patent: Sep. 8, 2009

(54) SYSTEM AND METHOD FOR FACETING A MASKING LAYER IN A PLASMA ETCH TO SLOPE A FEATURE EDGE

(75) Inventors: Thomas Bold, Roanoke, TX (US); Victor Torres, Irving, TX (US); Rodney Hill, Mansfield, TX (US)

(73) Assignee: National Semiconductor Corporation, Santa Clara, CA (US)

( * ) Notice: Subject to any disclaimer, the term of this patent is extended or adjusted under 35 U.S.C. 154(b) by 52 days.

(21) Appl. No.: 11/285,702

(22) Filed: Nov. 21, 2005

(51) Int. Cl.
*H01L 21/302* (2006.01)
*H01L 21/461* (2006.01)

(52) U.S. Cl. ............... 438/706; 438/710; 438/714; 438/717; 438/723; 438/725

(58) Field of Classification Search .......... None
See application file for complete search history.

(56) References Cited

U.S. PATENT DOCUMENTS

| | | | |
|---|---|---|---|
| 5,203,957 A | 4/1993 | Yoo et al. | |
| 5,346,585 A | 9/1994 | Doan et al. | |
| 5,384,278 A | 1/1995 | Singlevich | |
| 6,004,882 A * | 12/1999 | Kim et al. | 438/706 |
| 6,165,862 A | 12/2000 | Ishikawa et al. | |
| 2004/0012071 A1 | 1/2004 | Ido et al. | |
| 2007/0037386 A1 * | 2/2007 | Williams | 438/640 |

OTHER PUBLICATIONS

U.S. Appl. No. 11/080,177, filed Mar. 15, 2005, "System and Method for Faceting the Corners of a Resistor Protect Layer to Reduce Vertical Step Height".

* cited by examiner

*Primary Examiner*—Duy-Vu N Deo

(57) ABSTRACT

A method is disclosed for applying a plasma etch process to facet a masking layer in a semiconductor device by creating sloped surfaces in the masking layer. The masking layer is plasma etched with a plasma that has a high sputter etch component. The plasma etch process removes material from vertical edges of the masking layer to form a sloped surface at each vertical edge of the masking layer. A layer of conductive material is then applied to the masking layer. When the layer of conductive material is subsequently removed by an overetch process the sloped profile of the masking layer facilitates the removal of stringers of conductive material without using an excessively lengthy overetch.

20 Claims, 4 Drawing Sheets

SYSTEM AND METHOD FOR FACETING A MASKING LAYER IN A PLASMA ETCH TO SLOPE A FEATURE EDGE

TECHNICAL FIELD OF THE INVENTION

The present invention is generally directed to manufacturing technology for semiconductor devices and, in particular, to a system and method for faceting a masking layer in a plasma etch to slope a feature edge.

BACKGROUND OF THE INVENTION

In the manufacture of a semiconductor device a layer of conductive material (e.g., metal) may be deposited over an underlying structure. When portions of the layer of conductive material are later etched away there are usually some residual stringers of conductive material that are not removed from the features of the underlying structure. The stringers of conductive material usually remain at the corners of vertical feature edges. An excessive overetch process is usually required in order to remove the stringers of conductive material from the corners of the vertical feature edges.

For example, consider the prior art semiconductor device 100 shown in FIG. 1. The semiconductor device 100 comprises a silicon or silicon dioxide substrate 110, a thin film resistor (TFR) 120, a titanium tungsten (TiW) protective layer 130, and a patterned photoresist layer 140.

When a prior art plasma etch process is applied to the semiconductor device 100, the plasma etch process etches away portions of the photoresist layer 140 and portions of the titanium tungsten (TiW) protective layer 130. The result is shown in FIG. 2 where the etched semiconductor device is designated with reference numeral 200.

As shown in FIG. 2, the exposed flat surfaces 210 of the silicon substrate 110 and the vertical edges 220 of the titanium tungsten (TiW) protective layer 130 form corners at an angle of approximately ninety degrees (i.e., a right angle). Assume that the photoresist layer 140 is then removed and a conductive layer (not shown) is deposited over the semiconductor device. When the conductive layer is subsequently etched away the conductive layer leaves stringers of conductive material 310 lodged in the corners between the vertical edges 220 of the titanium tungsten (TiW) protective layer 130 and the flat surfaces 210 of the silicon substrate 110. The resulting structure 300 is shown in FIG. 3.

In order to remove the stringers 310 of conductive material at the feature edges it is necessary to continue to apply the etch process to the conductive material. The continuation of the etch process produces an excessive overetch that may produce other undesirable effects in the structure of the semiconductor device. For example, excessive loss of the titanium tungsten (TiW) protective layer 130 may occur to the point of exposing the thin film resistor (TFR) 120 to the plasma etch process. Such exposure would destroy the thin film resistor (TFR) 120.

For this reason the prior art approach described above is not desirable because it requires an excessive overetch process to be employed. Therefore, it would be advantageous to have an efficient system and method that can reduce the overetch process for the conductive material that is required to remove stringers of conductive material from portions of a semiconductor device.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts.

DETAILED DESCRIPTION OF THE INVENTION

Figure 1:
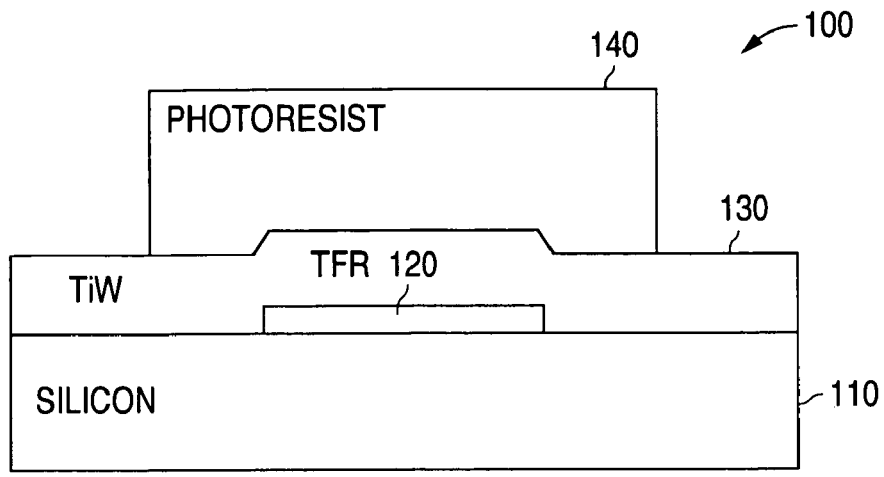
FIG. 1 illustrates a prior art semiconductor device for illustrating a prior art plasma etch process.
Figure 2:
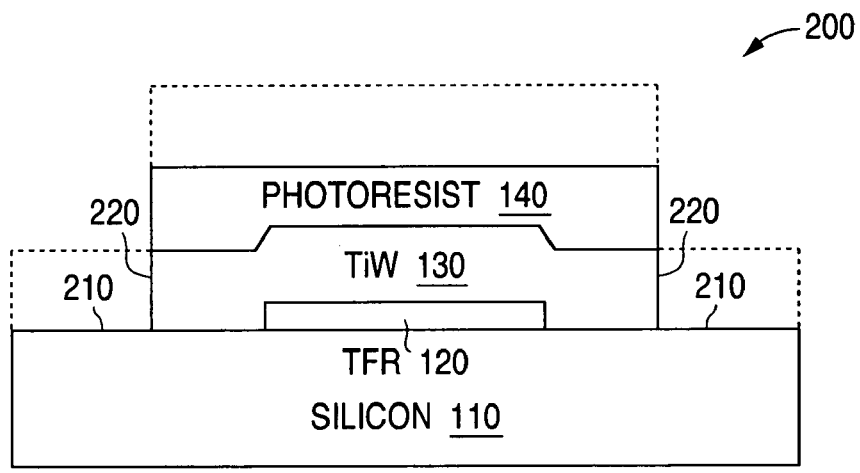
FIG. 2 illustrates the prior art semiconductor device shown in FIG. 1 after the application of a prior art plasma etch process.
Figure 3:
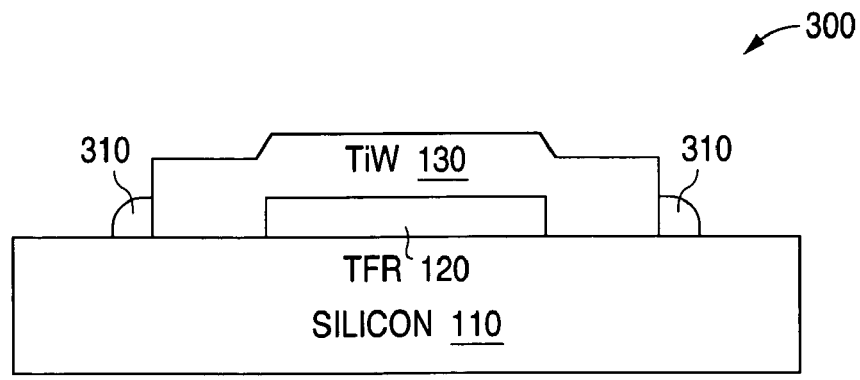
FIG. 3 illustrates the prior art semiconductor device shown in FIG. 2 showing residual stringers of conductive material that are formed after a layer of conductive material has been applied to the device and subsequently etched.

FIGS. 4 through 9, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged semiconductor device.

The method of the present invention forms sloped feature edges by faceting a masking layer during a plasma etch process. Much less overetch process is required to remove stringers of conductive material from a sloped feature edge.

Plasma etching is an anisotropic process. The etch in an anisotropic process is directional. When an anisotropic etch is applied vertically there is very little etch in the lateral directions. A plasma etch comprises both a physical component and a chemical component. The physical component of a plasma etch is sometimes referred to as sputter etching.

Sputter etching occurs by ion bombardment at the surface of the structure that is being etched. Energetic ions of the plasma transfer momentum to the atoms that are located near the surface of the structure. Some atoms are ejected from the surface resulting in a net removal of material. The sputter etch component of a plasma etch can be modified by adjusting the plasma etcher settings that control ion density and ion energy such as power, pressure, gas mixture, and the like.

The sputter yield is the number of ejected atoms per incident ion. The sputter yield is a function of the ion flux angle of incidence. Materials generally have higher sputter yields when the ion flux angle of incidence is off-normal (i.e., not at a right angle of ninety degrees (90°)) to the surface of the etched material. In one advantageous embodiment of the method of the invention the angular size of the off-normal ion flux angle of incidence has an angular size in a range of approximately forty five degrees (45°) to sixty five degrees (65°).

When a feature is plasma etched with a high sputter etch component, a facet (or sloped surface) will develop at the top corner of the feature as a result of the higher sputter yield. For example, the application of a plasma etch process that has been optimized to provide a high degree of sputter etching to a photoresist masking layer will produce a sloped profile in the top corners of the photoresist masking layer. Other materials that erode in plasma etch with a high sputter etch component (e.g., hardmasks, polymide, spin-on-glass) could be used in place of a photoresist layer.

A high sputter etch component of a plasma etch process has an amount of ion energy that is high enough to break the molecular bonds of the target material and provide additional energy to give momentum to the atomic and/or molecular fragments of the target material. In the case of photoresist material the carbon-carbon (C—C) bond strength is approximately six electron volts (6 eV) and the carbon-hydrogen (C—H) bond strength is approximately four electron volts (4 eV). Therefore the average ion energy of the high sputter etch component of the plasma etch process should be at least fifteen electron volts (15 eV).

The ion density needs to be high enough to obtain sufficient ion flux so that the etch front that is perpendicular to the facet moves measurably faster than the etch front that is perpendicular to the horizontal surface of the photoresist material.

Therefore the minimum ion density should be one hundred billion ions per cubic centimeter ($10^{11}$ ions/cm$^3$). Therefore, in order to generate a high sputter etch component of a plasma etch to perform the method of the invention, power/pressure/gas flow conditions in the etch chamber must produce a minimum average ion energy of fifteen electron volts (15 eV) and a minimum ion density of one hundred billion ions per cubic centimeter ($10^{11}$ ions/cm$^3$).

In one advantageous embodiment of the present invention (1) the inductive coil radio frequency (RF) power was set to four hundred fifty watts (450 W), and (2) the bias power was set to one hundred sixty watts (160 W), and (3) the pressure was set to seven (7) millitorr, and (4) the total gas flow was set to seventy five standard cubic centimeters per minute (75 sccm). These settings produced an average ion energy of sixty electron volts (60 eV) and an ion density of approximately one trillion ions per cubic centimeter ($10^{12}$ ions/cm$^3$).

Figure 4:
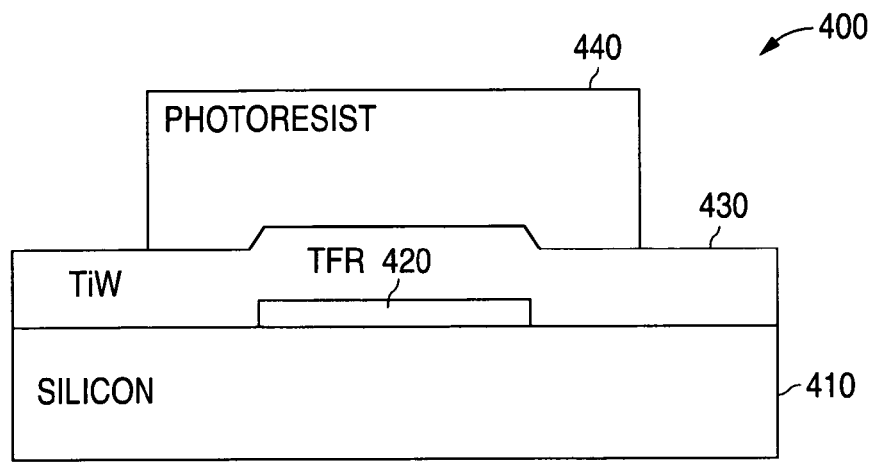
FIG. 4 illustrates a prior art semiconductor device for illustrating a plasma etch process of the present invention.
Figure 5:
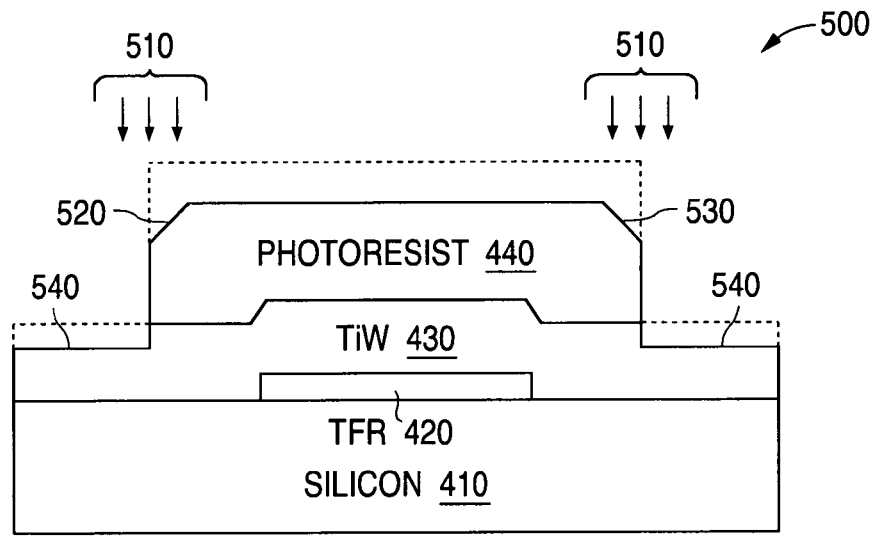
FIG. 5 illustrates the semiconductor device shown in FIG. 4 after an initial application of the plasma etch process of the present invention.

Consider the prior art semiconductor device 400 shown in FIG. 4. The semiconductor device 400 comprises a silicon or silicon dioxide substrate 410, a thin film resistor (TFR) 420, a titanium tungsten (TiW) protective layer 430, and a patterned photoresist layer 440. In an advantageous embodiment of the method of the present invention, a plasma etch process with a high sputter etch component is applied to the semiconductor device 400. The resulting structure 500 is shown in FIG. 5. The application of the plasma etch process and the resulting ion flux vectors are represented by the arrows 510.

As portions of photoresist layer 440 are etched away a first facet 520 forms at a first top corner of photoresist layer 440. At the same time a second facet 530 forms at a second top corner of photoresist layer 440. As will be described below, the size of the first facet 520 and the size of the second facet 530 will continue to increase as the plasma etch process continues. The etched surface of the titanium tungsten (TiW) protective layer 430 is designated by reference numeral 540.

Figure 6:
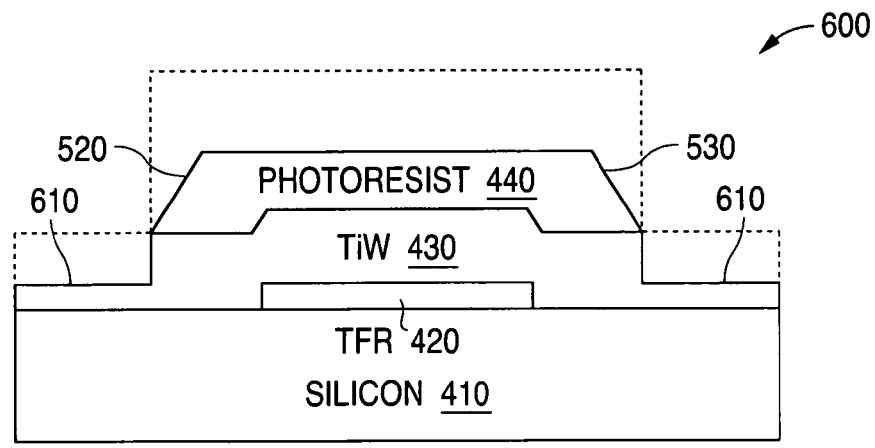
FIG. 6 illustrates the semiconductor device shown in FIG. 5 after a continued application of the plasma etch process of the present invention.

As the plasma etch process continues more and more of the photoresist layer 440 is etched away. FIG. 6 illustrates the semiconductor device 600 after a further application of the plasma etch process. For clarity the arrows 510 that represented the plasma etch process in FIG. 5 are not shown in FIG. 6.

The size of the first facet 520 and the size of the second facet 530 have increased. The lower edge of the first facet 520 and the lower edge of the second facet 530 now reach down to the top level of the underlying titanium tungsten (TiW) layer 430. The etched surface of the titanium tungsten (TiW) protective layer 430 is now at a lower level. The lower level of the etched surface of the titanium tungsten (TiW) protective layer 430 is designated by reference numeral 610.

Figure 7:
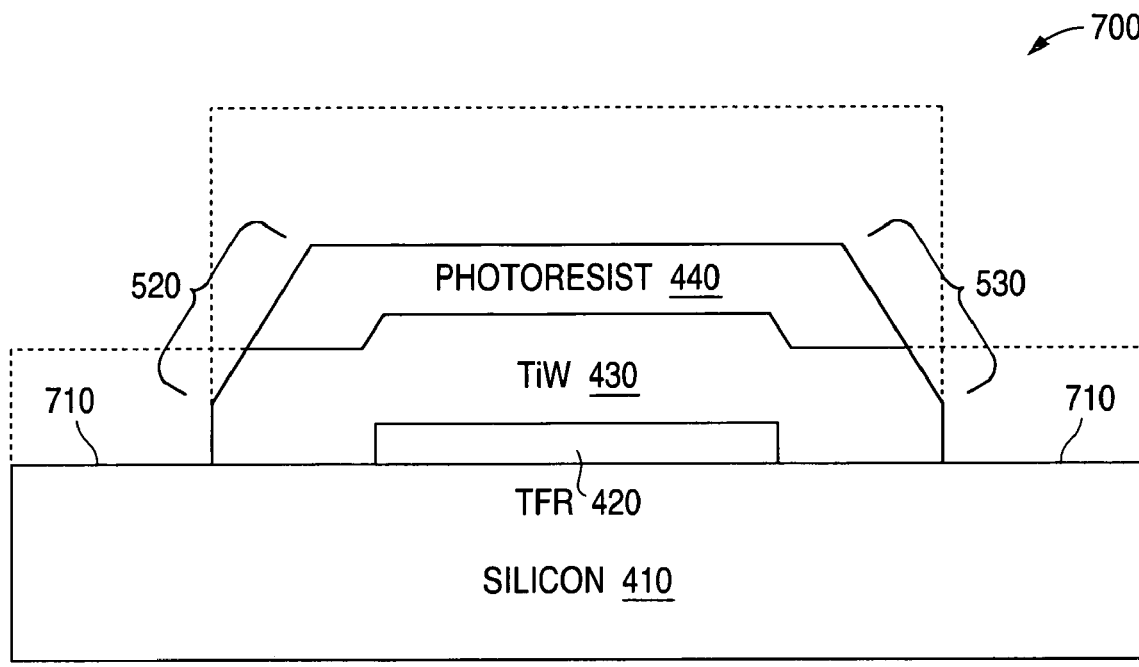
FIG. 7 illustrates the semiconductor device shown in FIG. 6 after a continued application of the plasma etch process of the present invention.

As the plasma etch process continues more and more of the photoresist layer 440 is etched away and the top corner portions of the titantium tungsten (TiW) protective layer 430 are etched away. FIG. 7 illustrates the semiconductor device 700 after a further application of the plasma etch process. For clarity the arrows 510 that represented the plasma etch process in FIG. 5 are not shown in FIG. 7.

The size of the first facet 520 and the size of the second facet 530 have increased. The lower edge of the first facet 520 and the lower edge of the second facet 530 now reach down through the top corners of the underlying titanium tungsten (TiW) protective layer 430. The flat surfaces of the titanium tungsten (TiW) protective layer 430 have now been etched away exposing the underlying substrate 410. The exposed top surfaces of the substrate 410 are designated by reference numeral 710.

Figure 8:
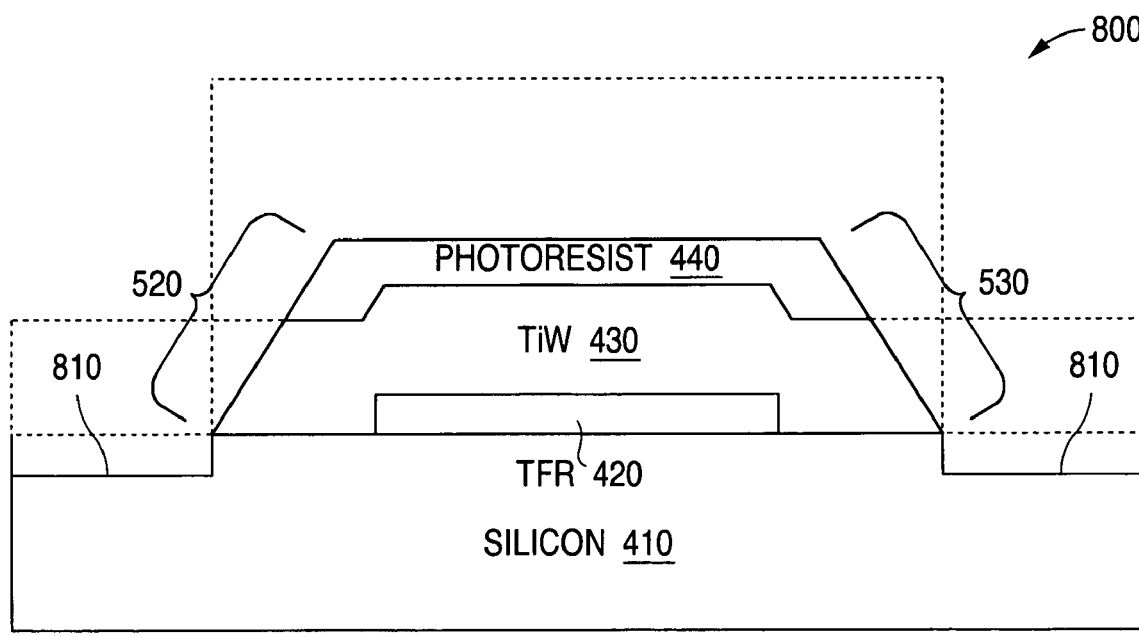
FIG. 8 illustrates the semiconductor device shown in FIG. 7 after a continued application of the plasma etch process of the present invention.

As the plasma etch process continues more and more of the photoresist layer 440 is etched away and additional portions of the titanium tungsten (TiW) protective layer 430 are etched away. FIG. 8 illustrates the semiconductor device 800 after a further application of the plasma etch process. For clarity the arrows 510 that represented the plasma etch process in FIG. 5 are not shown in FIG. 8.

The size of the first facet 520 and the size of the second facet 530 have increased. The lower edge of the first facet 520 and the lower edge of the second facet 530 now reach down through the underlying titanium tungsten (TiW) layer 430 to the top of the underlying substrate 410. The etched surface of the substrate 410 is now at a lower level. The lower level of the etched surface of the substrate 410 is designated by reference numeral 810.

The first facet 520 and the second facet 530 form a sloped surface in the side of the titanium tungsten (TiW) protective layer 430. The sloped surface provides a sloped feature edge that significantly reduces the vertical distance that must be etched in a layer of conductive material that is subsequently deposited on the semiconductor device. In the semiconductor device 800 shown in FIG. 8 there is a very small vertical edge at right angles to the etched surface 810 of the substrate 410.

The reduction in the size of the underlying vertical edges provided by the method of the present invention significantly reduces the amount of overetch that is subsequently required to remove stringers of conductive material.

Figure 9:
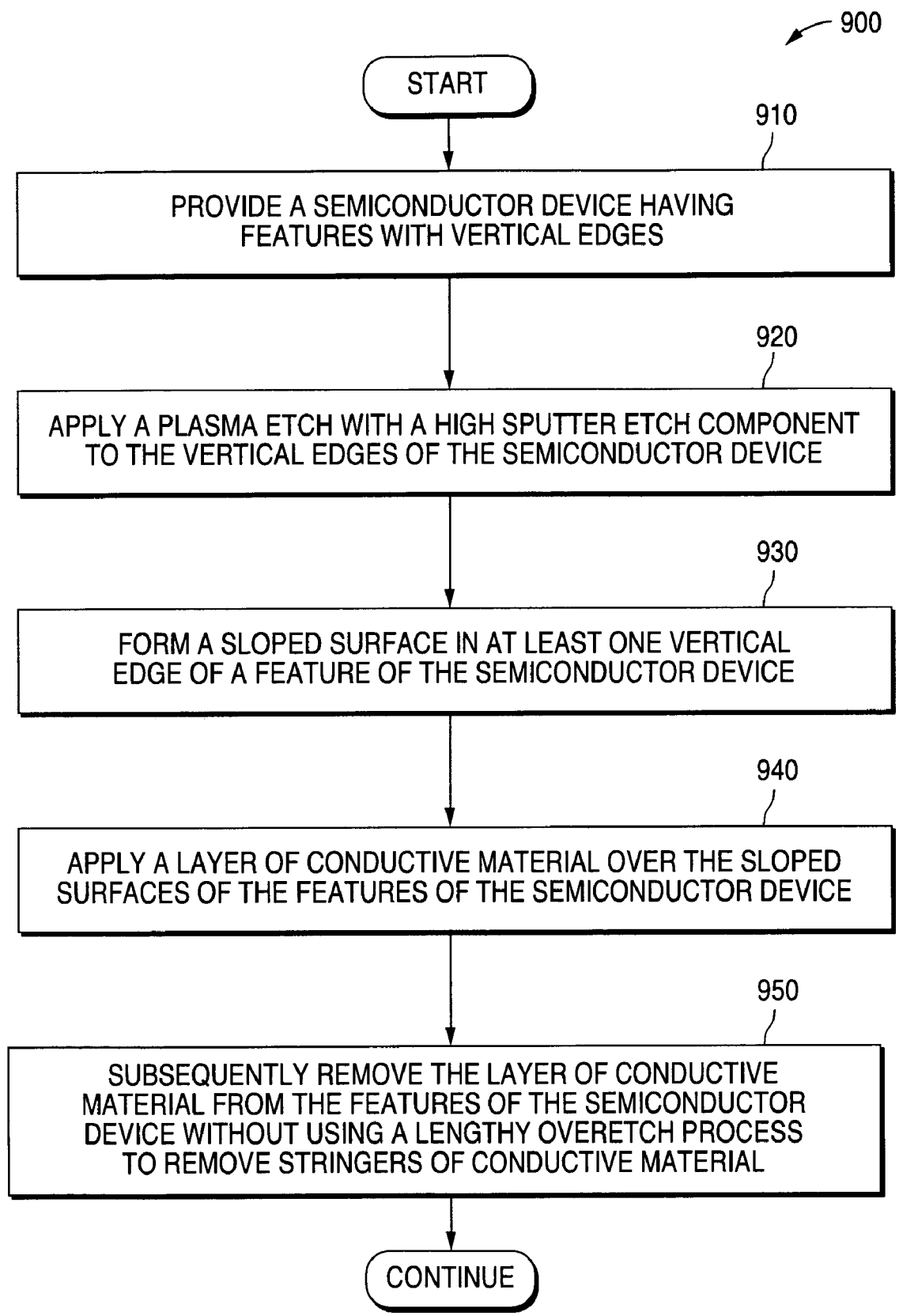
FIG. 9 illustrates a flow chart illustrating an advantageous embodiment of the method of the present invention.

FIG. 9 illustrates a flow chart 900 illustrating an advantageous embodiment of the method of the present invention. In the first step of the method a semiconductor device having features with vertical edges is provided (step 910). Then a plasma etch having a high sputter etch component is applied to the vertical edges of the semiconductor device (step 920).

The plasma etch forms a sloped surface in at least one vertical edge of a feature of the semiconductor device (step 930). A layer of conductive material is then applied over the sloped surfaces of the features of the semiconductor device (step 940). The layer of conductive material is then subsequently removed from the features of the semiconductor device without requiring a lengthy overetch process to remove stringers of conductive material (step 950).

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A method for preparing a first layer that covers a thin film circuit element in a semiconductor device for an application and removal of a second layer of material, said method comprising the steps of:
    applying a photoresist layer over said first layer;
    applying to said first layer and said photoresist layer a plasma etch process having a high sputter etch component;
    etching away material of said first layer and said photoresist layer with said plasma etch process to form a sloped surface in said first layer and said photoresist layer and a vertical edge in a substrate layer without uncovering said thin film circuit element, wherein the vertical edge is shorter than the sloped surface;
    applying said second layer of material to said sloped surface in said first layer and said photoresist layer; and
    subsequently removing said second layer with an overetch process to remove stringers of material of said second layer adjacent to the vertical edge.

2. The method as set forth in claim 1 wherein said step of etching away material of said first layer and said photoresist layer with said plasma etch process comprises the step of:
    etching away material of said first layer and said photoresist layer with said high sputter etch component of said plasma etch process to form said sloped surface in said first layer and said photoresist layer and said vertical edge in a substrate layer.

3. The method as set forth in claim 1 wherein said plasma etch process comprises:
    an average ion energy of at least fifteen electron volts; and
    an average ion density of at least one hundred billion ions per cubic centimeter.

4. The method as set forth in claim 1 wherein said step of applying said plasma etch process having said high sputter etch component comprises the step of:
    applying said plasma etch process having said high sputter etch component to at least one vertical edge of said first layer.

5. The method as set forth in claim 4 wherein said plasma etch process forms an ion flux angle with said sloped surface, and wherein said ion flux angle has an angular size in a range of approximately forty five degrees to sixty five degrees.

6. The method as set forth in claim 4 further comprising the step of:
    continually applying said plasma etch process until said sloped surface is formed to minimize said vertical edge of said first layer.

7. A method for preparing a portion of a semiconductor device that covers a thin film circuit element for an application and removal of a layer of material, said method comprising the steps of:
    applying to said portion of said semiconductor device a plasma etch process having a high sputter etch component;
    etching away material of said portion of said semiconductor device with said plasma etch process to form a sloped surface in said portion of said semiconductor device and a vertical edge in a substrate layer without uncovering said thin film circuit element, wherein the vertical edge is shorter than the sloped surface;
    applying said layer of material to said portion of said semiconductor device; and
    subsequently removing said layer of material with an overetch process to remove stringers of material of said layer adjacent to the vertical edge.

8. The method as set forth in claim 7 wherein said step of etching away material of said portion of said semiconductor device with said plasma etch process comprises the step of:
    etching away material of said portion of said semiconductor device with said high sputter etch component of said plasma etch process to form said sloped surface in said portion of said semiconductor device and said vertical edge in said substrate layer.

9. The method as set forth in claim 7 wherein said plasma etch process comprises:
    an average ion energy of at least fifteen electron volts; and
    an average ion density of at least one hundred billion ions per cubic centimeter.

10. The method as set forth in claim 7 wherein said step of applying to said portion of said semiconductor device said plasma etch process having said high sputter etch component comprises the step of:
    applying said plasma etch process having said high sputter etch component to at least one vertical edge of said portion of said semiconductor device.

11. The method as set forth in claim 10 wherein said plasma etch process forms an ion flux angle with said sloped surface, and wherein said ion flux angle has an angular size in a range of approximately forty five degrees to sixty five degrees.

12. The method as set forth in claim 10 further comprising the step of:
    continually applying said plasma etch process until said sloped surface is formed to minimize said vertical edge of said portion of said semiconductor device.

13. A method for reducing an amount of overetch process required to remove stringers of a material from a semiconductor device that covers an underlying circuit element, said method comprising the steps of:

applying to a portion of said semiconductor device a plasma etch process having a high sputter etch component;

etching away said portion of said semiconductor device with said plasma etch process to form a sloped surface in said portion of said semiconductor device and a vertical edge in a substrate layer without uncovering said underlying circuit element, wherein the vertical edge is shorter than the sloped surface;

applying said material over said sloped surface of said portion of said semiconductor device; and subsequently removing said material with an overetch process to remove stringers of said material adjacent to the vertical edge.

14. The method as set forth in claim 13 wherein said step of etching away said portion of said semiconductor device with said plasma etch process comprises the step of:

etching away said portion of said semiconductor device with said high sputter etch component of said plasma etch process to form said sloped surface in said portion of said semiconductor device and said vertical edge in said substrate layer.

15. The method as set forth in claim 13 wherein said plasma etch process comprises:

an average ion energy of at least fifteen electron volts; and an average ion density of at least one hundred billion ions per cubic centimeter.

16. The method as set forth in claim 13 wherein said step of applying said plasma etch process having said high sputter etch component comprises the step of:

applying said plasma etch process to at least one vertical edge of said portion of said semiconductor device.

17. The method as set forth in claim 16 wherein said plasma etch process forms an ion flux angle with said sloped surface, and wherein said ion flux angle has an angular size in a range of approximately forty five degrees to sixty five degrees.

18. The method as set forth in claim 16 further comprising the step of:

continually applying said plasma etch process until said sloped surface is formed to minimize said vertical edge of said portion of said semiconductor device.

19. The method as set forth in claim 13 wherein said plasma etch process comprises:

an average ion energy of approximately sixty electron volts; and an average ion density of approximately one trillion ions per cubic centimeter.

20. The method as set forth in claim 13 wherein applying said material over said sloped surface of said portion of said semiconductor device comprises applying a layer of conductive material over said sloped surface of said portion of said semiconductor device.

* * * * *